(12) United States Patent
Park

(10) Patent No.: US 8,773,901 B2
(45) Date of Patent: Jul. 8, 2014

(54) NONVOLATILE MEMORY DEVICE PREVENTING SHIFT IN THRESHOLD VOLTAGE OF ERASE CELL AND PROGRAM METHOD THEREOF

(75) Inventor: Jin Su Park, Daegu (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 326 days.

(21) Appl. No.: 13/178,985

(22) Filed: Jul. 8, 2011

(65) Prior Publication Data
US 2012/0011306 A1    Jan. 12, 2012

(30) Foreign Application Priority Data
Jul. 9, 2010   (KR) .......................... 10-2010-0066487

(51) Int. Cl.
*G11C 11/34*   (2006.01)
(52) U.S. Cl.
USPC ................................. 365/185.02; 365/185.03
(58) Field of Classification Search
USPC ............. 365/185.02, 185.03, 185.12, 185.17, 365/189.29
See application file for complete search history.

(56) References Cited

U.S. PATENT DOCUMENTS

| | | | |
|---|---|---|---|
| 7,161,842 B2 * | 1/2007 | Park | 365/185.33 |
| 2008/0084768 A1 * | 4/2008 | Park et al. | 365/189.05 |
| 2009/0168543 A1 * | 7/2009 | Kim et al. | 365/185.29 |
| 2009/0303789 A1 * | 12/2009 | Fernandes | 365/185.03 |

FOREIGN PATENT DOCUMENTS

| | | |
|---|---|---|
| KR | 1020010004269 | 1/2001 |
| KR | 100630535 | 9/2006 |
| KR | 100866954 | 11/2008 |
| KR | 1020080114203 | 12/2008 |

OTHER PUBLICATIONS

Notice of Allowance issued by the Korean Intellectual Property Office on Mar. 26, 2012.

* cited by examiner

*Primary Examiner* — Tuan T Nguyen
*Assistant Examiner* — Khamdan Alrobaie
(74) *Attorney, Agent, or Firm* — IP & T Group LLP

(57) ABSTRACT

A program method of a nonvolatile memory device includes programming data of a first bit into a target page of a plurality of pages in a memory cell array, sensing the programmed data and storing the sensed data in a page buffer coupled to the memory cell array, erasing data of the target page, inputting data of a second bit to the page buffer and generating program data by combining the data of the second bit and the data of the first bit stored in the page buffer, and programming the program data into the target page.

7 Claims, 4 Drawing Sheets

Program cell

Erase cell

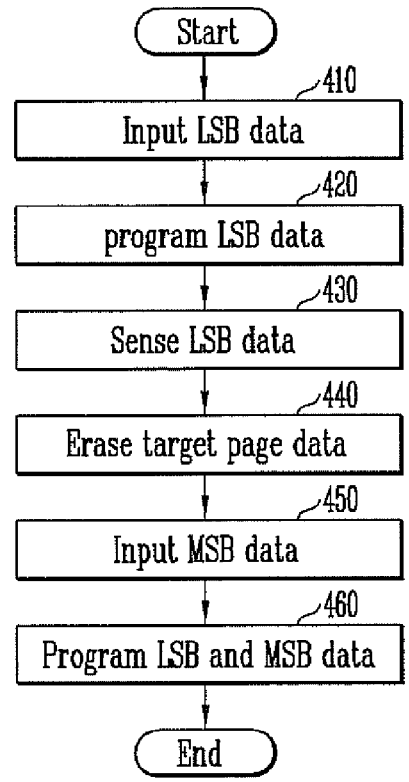
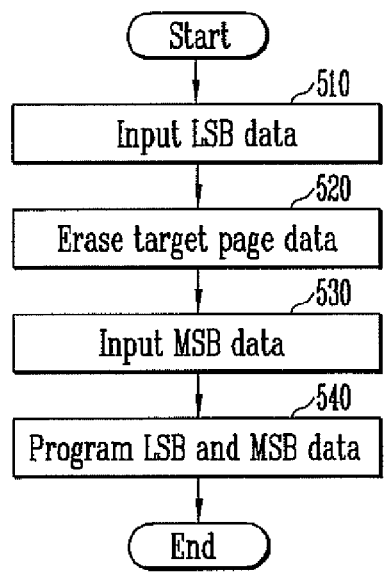

NONVOLATILE MEMORY DEVICE PREVENTING SHIFT IN THRESHOLD VOLTAGE OF ERASE CELL AND PROGRAM METHOD THEREOF

CROSS-REFERENCE TO RELATED APPLICATION

Priority to Korean patent application number 10-2010-0066487 filed on Jul. 9, 2010, the entire disclosure of which is incorporated by reference herein, is claimed.

BACKGROUND

Exemplary embodiments relate to a nonvolatile memory device and a program method thereof and, more particularly, to a nonvolatile memory device and a program method thereof, which are capable of prohibiting a shift in the threshold voltage of an erase cell.

In nonvolatile memory devices which enable electrical program and erasure of data without the refresh function of rewriting data at specific intervals, the interval between neighboring memory cells narrows with an increase in the degree of integration.

FIGS. 1A and 1B are diagrams illustrating the influence on program cells and erase cells due to the interference between neighboring memory cells.

As shown in FIGS. 1A and 1B, a program cell is subjected to a coupling effect from neighboring memory cells that are simultaneously being programmed, whereas an erase cell is subjected to a coupling effect due to all neighboring memory cells regardless of whether they are simultaneously erased. Accordingly, a threshold voltage of the erase cell may be more widely distributed than that of the program cell.

FIG. 2 shows a shift in the threshold voltage distribution of an erase cell.

As shown in FIG. 2, the threshold voltage distribution of an erase cell is shifted due to the program operation for neighboring memory cells. For example, in the case where all memory cells adjacent to an erase cell are programmed with a third threshold voltage distribution C, the erase cell may experience the greatest shift in the threshold voltage distribution. Accordingly, at the time of a read operation, the erase cell may be erroneously read as if it has the threshold voltage distribution of a program cell, for example, a first threshold voltage distribution A.

BRIEF SUMMARY

Exemplary embodiments relate to a program method of a nonvolatile memory device. According to the embodiments, after a least significant bit (LSB) program operation is performed on a selected page, the least significant bit (LSB) data of the selected page is sensed and stored in a page buffer, and an erase operation is then performed on the selected page. Next, most significant bit (MSB) data is inputted to the page buffer, and a program operation is then performed on the selected page using the previously stored least significant bit (LSB) data and the newly inputted most significant bit (MSB) data. Accordingly, a margin for a read operation can be increased due to a lack of a shift in the threshold voltage distribution of erase cells included in the selected page.

A program method of a nonvolatile memory device according to an aspect of this disclosure includes programming data of a first bit into a target page of a plurality of pages in a memory cell array, sensing the programmed data and storing the sensed data in a page buffer coupled to the memory cell array, erasing data of the target page, inputting data of a second bit to the page buffer and generating program data by combining the data of the second bit and the data of the first bit stored in the page buffer, and programming the program data into the target page.

A program method of a nonvolatile memory device according to another exemplary embodiment of this disclosure includes inputting least significant bit (LSB) data to be programmed into a target page of plurality of pages, included in a memory cell array, to a page buffer coupled to the memory cell array, erasing data of the target page, inputting most significant bit (MSB) data to the page buffer, and combining the least significant bit (LSB) data and the most significant bit (MSB) data and programming the combination data into the target page as program data.

A program method of a nonvolatile memory device according to further exemplary embodiment of this disclosure includes inputting least significant bit (LSB) data to a first latch of a page buffer, erasing data of a target page of a plurality of pages in a memory cell array, inputting most significant bit (MSB) data to a second latch of the page buffer, and combining the MSB data and the LSB data stored in the page buffer and programming the combination data into the target page.

A nonvolatile memory device according to an aspect of this disclosure includes a memory cell array including a plurality of pages and a page buffer coupled to the memory cell array and including first, second, and third latches. During a program operation, the page buffer is configured to input least significant bit (LSB) data to the first latch, erase data of a target page, input most significant bit (MSB) data to the second latch, generate program data by combining the most significant bit (MSB) data and the least significant bit (LSB) data, store the program data in the third latch, and program the program data into the target page.

BRIEF DESCRIPTION OF THE DRAWINGS

FIG. 4 is a flowchart illustrating a program method according to a first exemplary embodiment of this disclosure; and FIG. 5 is a flowchart illustrating a program method according to a second exemplary embodiment of this disclosure.

DESCRIPTION OF EMBODIMENTS

Hereinafter, some exemplary embodiments of the present disclosure will be described in detail with reference to the accompanying drawings. The figures are provided to enable those of ordinary skill in the art to make and use the exemplary embodiments of the disclosure.

Figure 1A:
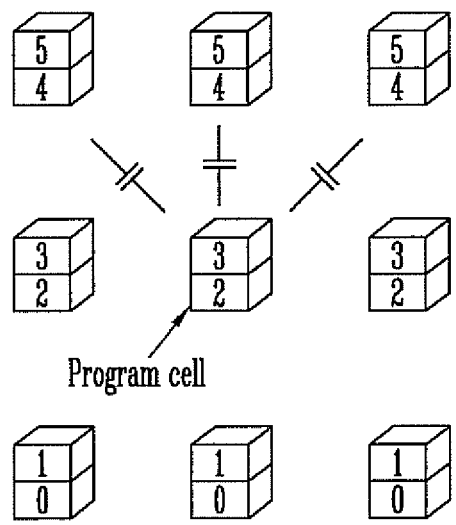
FIGS. 1A and 1B are diagrams illustrating the influence on program cells and erase cells due to the interference between neighboring memory cells.
Figure 1B:
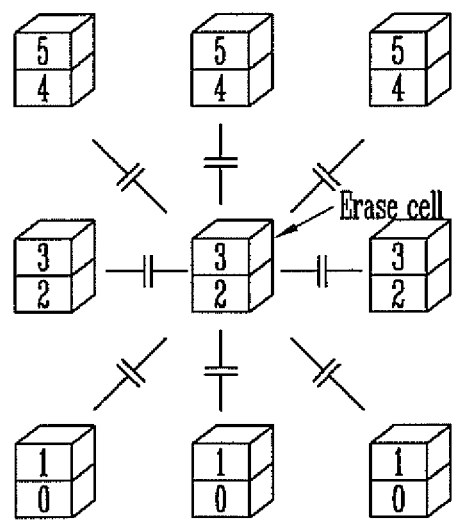
Figure 2:
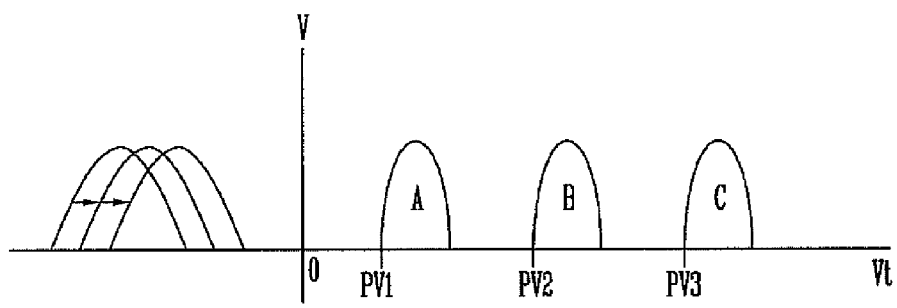
FIG. 2 shows a shift in the threshold voltage distribution of an erase cell.
Figure 3:
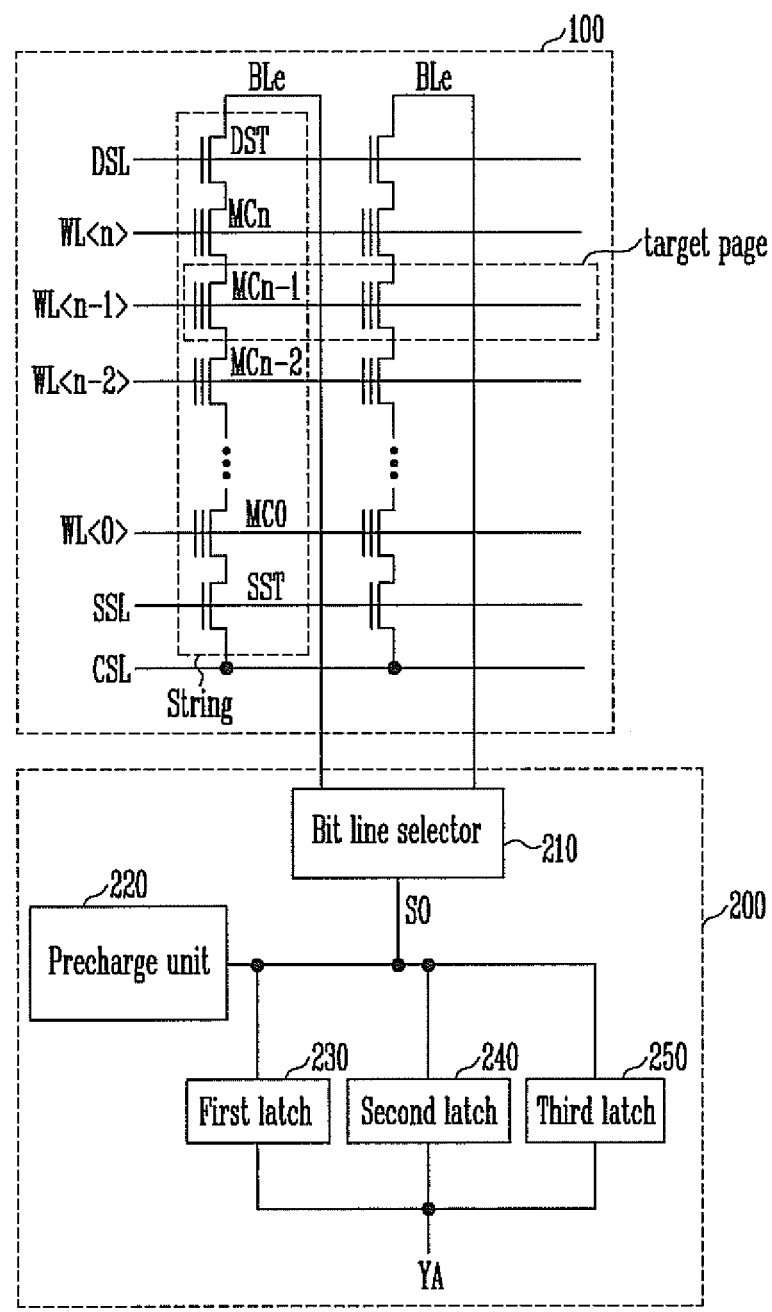
FIG. 3 is a configuration showing a memory cell array and a page buffer of a nonvolatile memory device.

FIG. 3 is a configuration showing a memory cell array and a page buffer of a nonvolatile memory device and.

Referring to FIG. 3, the memory cell array 100 includes a plurality of strings. Each of the strings includes a drain select transistor DST, a plurality of memory cells MCn to MC0, and a source select transistor SST coupled in series between a bit line (for example, BLe) and a common source line CSL.

Memory cells coupled to the same word line, among the plurality of memory cells of the memory cell array 100, are classified as the same page. For example, the memory cells MCn−1 included in respective strings and coupled to a word line WLn−1 are defined as a page.

The page buffer 200 is coupled to the bit lines BLe and BLo of the memory cell array 100. The page buffer 200 includes a bit line selector 210, a precharge unit 220, a first latch 230, a second latch 240, and a third latch 250. The bit line selector 210 selectively couples the even bit line BLe or the odd bit line BLo to the sense node SO of the page buffer 200. The precharge unit 220 precharges the sense node SO by supplying a power supply voltage to the sense node SO. The first latch 230 temporarily stores least significant bit (LSB) of program data received from an I/O terminal YA when an operation of inputting the program data is performed. The first latch 230 may send the stored program data to the memory cell of a target page through the bit line selectively coupled to the sense node SO through the bit line selector 210. The first latch 230 may sense a program state of the memory cell of the target page through the bit line selectively coupled to the sense node SO when a sense operation is performed and store the sensed data. The second latch 240 temporarily stores most significant bit (MSB) of the program data received from the I/O terminal YA when the operation of inputting the program data is performed. The third latch 250 combines the least significant bit (LSB) data and the most significant bit (MSB) data, respectively stored in the first and second latches 230 and 240. When an operation of programming both the least significant bit (LSB) data and the most significant bit (MSB) data is performed, the third latch 250 sends a result of the combination to the memory cell as the program data.

FIG. 4 is a flowchart illustrating a program method according to a first exemplary embodiment of this disclosure.

The program method of a semiconductor memory device according to the exemplary embodiment of this disclosure is described below with reference to FIGS. 3 and 4.

1) Input of Least Significant Bit (LSB) Data (410)

Least significant bit (LSB) data to be programmed into a target page of the memory cell array 100 is stored in the first latch 230 of the page buffer 200. More particularly, the least significant bit (LSB) data is transmitted to the first latch 230 through the I/O terminal YA coupled to the page buffer 200 and then temporarily stored therein.

2) Program of Least Significant Bit (LSB) Data (420)

The least significant bit (LSB) data is programmed into the target page of the memory cell array 100 by performing a least significant bit (LSB) data program operation. More particularly, the bit line selector 210 of the page buffer 200 selects one (for example, the even bit line BLe) of the even and odd bit lines BLe and BLo and couples the selected bit line BLe to the sense node SO. The voltage level of the sense node SO is controlled to be a high level or a low level in response to the least significant bit (LSB) data stored in the first latch 230, and the voltage level of the bit line BLe coupled to the sense node SO is also controlled in response to the controlled voltage level of the sense node SO. Next, a program voltage is supplied to the word line WL<n−1> coupled to the target page, so that the least significant bit (LSB) data is programmed into the selected memory cell MCn−1 of the target page.

3) Sense of Least Significant Bit (LSB) Data (430)

The data programmed into the selected memory cell MCn−1 of the target page of the memory cell array 100 is sensed and stored in the page buffer 200. More particularly, a read voltage is supplied to the word line WL<n−1> coupled to the target page, and a pass voltage is supplied to the remaining word lines WL<0> to WL<n−2> and WL<n> except the word line WL<n−1>. Next, the bit line selector 210 of the page buffer 200 selects the even bit line BLe and couples it to the sense node SO. The voltage levels of the even bit line BLe and the sense node SO are maintained in a high level or discharged to a low level according to a program state of the selected memory cell MCn−1. The first latch 230 senses the voltage level of the sense node SO and stores the sensed voltage level as the least significant bit (LSB) data of the selected memory cell MCn−1.

4) Erase of Target Page Data (440)

Data stored in the memory cells of the target page of the memory cell array 100 is erased. Here, the erase operation is performed on only the memory cells of the target page. An example of the erase operation performed per page is described below.

First, an operation voltage of 0 V is supplied to the selected word line WL<n−1> coupled to the target page, and an erase-inhibition voltage of about 5 V is supplied to the remaining word lines WL<0> to WL<n−2> and WL<n> except the word line WL<n−1>. Next, an erase voltage of about 18 V to 20 V is supplied to the P well of the semiconductor substrate in which the memory cell array 100 is disposed. Electric charges stored in the floating gates of the memory cells coupled to the word line WL<n−1> tunnel toward semiconductor substrate by means of the erase voltage and thus are erased. However, electric charges stored in the floating gates of memory cells coupled to the remaining word lines WL<0> to WL<n−2> and WL<n> may not tunnel through due to the erase-inhibition voltage supplied to the gates of the memory cells although the erase voltage is supplied to the P well of the semiconductor substrate. Accordingly, the electric charges stored in the floating gates of memory cells coupled to the remaining word lines WL<0> to WL<n−2> and WL<n> are not erased. In this manner, only the memory cells of the target page are erased.

5) Input of Most Significant Bit (MSB) Data (450)

Most significant bit (MSB) data to be programmed into the target page of the memory cell array 100 is stored in the second latch 240 of the page buffer 200. More particularly, the most significant bit (MSB) data is transmitted to the second latch 240 through the I/O terminal YA coupled to the page buffer 200 and then temporarily stored therein.

6) Program of Least Significant Bit (LSB) Data and Most Significant Bit (MSB) Data (460)

The sensed least significant bit (LSB) data and the most significant bit (MSB) data respectively stored in the first latch 230 and the second latch 240 are combined and stored in the third latch 250. Next, the combination data stored in the third latch 250 is transmitted to the selected memory cell (for example, MCn−1) of the target page through the sense node SO and programmed into the memory cell MCn−1, by performing a program operation.

As described above, according to the exemplary embodiment of this disclosure, after the programmed least significant bit (LSB) data is sensed, a target page data is erased, and the least significant bit (LSB) data and most significant bit (MSB) data are combined and programmed. Accordingly, a shift in the threshold voltage of a memory cell due to interference, occurring when a least significant bit (LSB) program operation is performed, can be prohibited.

FIG. 5 is a flowchart illustrating a program method according to a second exemplary embodiment of this disclosure.

The program method of a semiconductor memory device according to another exemplary embodiment of this disclosure is described below with reference to FIGS. 3 and 5.

1) Input of Least Significant Bit (LSB) Data (510)

Least significant bit (LSB) data to be programmed into a target page of the memory cell array 100 is stored in the first latch 230 of the page buffer 200. More particularly, the least significant bit (LSB) data is transmitted to the first latch 230 through the I/O terminal YA coupled to the page buffer 200 and is temporarily stored in the first latch 230.

2) Erase of Target Page Data (520)

Data stored in the memory cells of the target page of the memory cell array 100 is erased. Although a program operation has not been performed on the target page, the threshold voltages of the memory cells of the target page may rise due to interference occurring when the program operation was performed on a previous page that was programmed. For this reason, the erase operation is performed on the target page. Here, the erase operation is performed per page in order to erase the data stored in, for example, only the memory cells of the target page. An example of the erase operation performed per page is described below.

First, an operation voltage of 0 V is supplied to a selected word line (for example, WL<n−1>) coupled to the target page, and an erase-inhibition voltage of about 5 V is supplied to the remaining word lines WL<0> to WL<n−2> and WL<n> except the word line WL<n−1>. Next, an erase voltage of about 18 V to 20 V is supplied to the P well of the semiconductor substrate in which the memory cell array 100 is disposed. Electric charges stored in the floating gate of memory cells coupled to the word line WL<n−1> tunnel toward the semiconductor substrate by means of the erase voltage and thus are erased. However, electric charges stored in the floating gates of memory cells coupled to the remaining word lines WL<0> to WL<n−2> and WL<n> may not tunnel through due to the erase-inhibition voltage supplied to the gates of the memory cells although the erase voltage is supplied to the P well of the semiconductor substrate. Accordingly, the electric charges stored in the floating gates of memory cells coupled to the remaining word lines WL<0> to WL<n−2> and WL<n> are not erased. In this manner, only the memory cells of the target page are erased.

3) Input of Most Significant Bit (MSB) Data (530)

Most significant bit (MSB) data to be programmed into the target page of the memory cell array 100 is stored in the second latch 240 of the page buffer 200. More particularly, the most significant bit (MSB) data is transmitted to the second latch 240 through the I/O terminal YA coupled to the page buffer 200 and is then temporarily stored in the second latch 240.

4) Program of Least Significant Bit (LSB) Data and Most Significant Bit (MSB) Data (540)

The least significant bit (LSB) data and the most significant bit (MSB) data respectively stored in the first latch 230 and the second latch 240 are combined and stored in the third latch 250. Next, the combination data stored in the third latch 250 is transmitted to the selected memory cell (for example, MCn−1) of the target page through the sense node SO and programmed into the memory cell MCn−1, by performing a program operation.

As described above, according to the present embodiment of this disclosure, after the least significant bit (LSB) data is inputted to the page buffer, a target page data is erased, and the least significant bit (LSB) data and most significant bit (MSB) data are combined and programmed. Accordingly, a shift in the threshold voltage of a memory cell due to interference, occurring when a least significant bit (LSB) program operation is performed, can be prohibited.

According to the present disclosure, after a least significant bit (LSB) program operation is performed on a selected page, a least significant bit (LSB) data of the selected page is sensed and stored in the page buffer, and a data of the selected page is then erased. Next, after a most significant bit (MSB) data is inputted to the page buffer, a program operation is performed on the selected page using the least significant bit (LSB) data and the most significant bit (MSB) data stored in the page buffer. Accordingly, a shift in the threshold voltage distributions of erase cells of a selected page can be prohibited and so a margin for a read operation can be increased.

What is claimed is:

1. A program method of a nonvolatile memory device, comprising:
   programming data of a first bit into a target page of a plurality of pages in a memory cell array;
   sensing the programmed data and storing the sensed data in a page buffer coupled to the memory cell array;
   erasing data of the target page;
   inputting data of a second bit to the page buffer and generating program data by combining the data of the second bit and the data of the first bit stored in the page buffer; and
   programming the program data into the target page.

2. The program method of claim 1, wherein the erasing of the data of the target page is performed by simultaneously supplying a first erase voltage to a word line coupled to the target page and a pass voltage higher than the first erase voltage to word lines coupled to pages other than the target page and by supplying a second erase voltage of a high potential to a well region of a semiconductor substrate in which the memory cell array is formed.

3. The program method of claim 1, wherein the generating of the program data comprises:
   transmitting the data of the first bit, stored in a first latch of the page buffer, to a third latch of the page buffer;
   transmitting the data of the second bit, stored in a second latch of the page buffer, to the third latch of the page buffer; and
   defining data stored in the third latch, as the program data.

4. The program method of claim 1, wherein the first and second bits of the data includes least significant bit most significant bit, respectively.

5. A program method of a nonvolatile memory device, comprising:
   inputting least significant bit (LSB) data to a first latch of a page buffer;
   programming the LSB data into a target page;
   sensing the programmed LSB data and storing the sensed LSB data in the first latch of the page buffer;
   erasing data of the target page of a plurality of pages in a memory cell array;
   inputting most significant bit (MSB) data to a second latch of the page buffer; and
   combining the MSB data and the LSB data stored in the page buffer and programming a combination data into the target page.

6. The program method of claim 5, wherein the erasing of the data of the target page is performed by simultaneously supplying a first erase voltage to a word line coupled to the target and a pass voltage higher than the first erase voltage to word lines coupled to pages other than the target page and by supplying a second erase voltage of a high potential to a well region of a semiconductor substrate in which the memory cell array is formed.

7. A nonvolatile memory device comprising:
   a memory cell array comprising a plurality of pages; and
   a page buffer coupled to the memory cell array and comprising first, second, and third latches,
   wherein during a program operation, the page buffer is configured to:
   input least significant bit (LSB) data to the first latch and store the LSB data in the first latch;

erase data stored in a target page of the plurality of pages;
input most significant bit (MSB) data to the second latch, generate program data by combining the MSB data and the LSB data, and store the program data in the third latch; and
program the program data into the target page,
wherein the page buffer is configured to program the store LSB data into the target page of memory cell array, sense the LSB data programmed into the target page, and store the sensed data in the first latch, before erasing the data stored in the target page.

* * * * *